United States Patent
Park et al.

(10) Patent No.: US 10,991,601 B2
(45) Date of Patent: Apr. 27, 2021

(54) APPARATUS AND METHOD FOR TREATING SUBSTRATE

(71) Applicant: SEMES CO., LTD., Cheonan-si (KR)

(72) Inventors: Hwangsoo Park, Cheonan-si (KR); Jun Ho You, Cheonan-si (KR); Doo Young Oh, Asan-si (KR); Jaehun Jeong, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/515,299

(22) Filed: Jul. 18, 2019

(65) Prior Publication Data

US 2020/0027761 A1 Jan. 23, 2020

(30) Foreign Application Priority Data

Jul. 18, 2018 (KR) .................. 10-2018-0083704

(51) Int. Cl.
*H01L 21/67* (2006.01)
*H01L 21/02* (2006.01)
(Continued)

(52) U.S. Cl.
CPC ...... *H01L 21/6704* (2013.01); *G03F 7/70925* (2013.01); *H01L 21/02041* (2013.01);
(Continued)

(58) Field of Classification Search
CPC ......... H01L 21/02041; H01L 21/02658; H01L 21/6838; H01L 21/67; H01L 21/67005;
(Continued)

(56) References Cited

U.S. PATENT DOCUMENTS

2001/0054431 A1* 12/2001 Masui ................ B08B 3/08
134/3
2009/0101181 A1* 4/2009 Morisawa ......... H01L 21/67219
134/94.1
(Continued)

FOREIGN PATENT DOCUMENTS

KR  1020110054355 A  5/2011
KR  10-1057118 B  8/2011
(Continued)

OTHER PUBLICATIONS

Korean Patent Office, Office action dated Jul. 17, 2019.
Korean Patent Office, Notice of Allowance dated Mar. 4, 2020.

*Primary Examiner* — Eduardo A Rodela
(74) *Attorney, Agent, or Firm* — Li & Cai Intellectual Property (USA) Office

(57) ABSTRACT

A method for treating a substrate includes a substrate treating step of treating the substrate by dispensing a treating liquid onto the substrate while rotating the substrate supported on a support plate in a processing space of a processing vessel and a vessel cleaning step of cleaning the processing vessel by dispensing a cleaning solution onto a jig while rotating the jig supported on the support plate. In the substrate treating step, the substrate is clamped to the support plate by a first vacuum pressure applied to the substrate. The vessel cleaning step includes a first clamping step of clamping the jig to the support plate by applying a second vacuum pressure to the jig. The first vacuum pressure and the second vacuum pressure are different from each other.

8 Claims, 13 Drawing Sheets

(51) Int. Cl.
    *H01L 21/683*     (2006.01)
    *H01L 21/687*     (2006.01)
    *G03F 7/20*     (2006.01)

(52) U.S. Cl.
    CPC .. *H01L 21/02658* (2013.01); *H01L 21/67011* (2013.01); *H01L 21/67023* (2013.01); *H01L 21/67051* (2013.01); *H01L 21/67069* (2013.01); *H01L 21/6838* (2013.01); *H01L 21/68764* (2013.01)

(58) Field of Classification Search
    CPC ......... H01L 21/67011; H01L 21/67023; H01L 21/6704; H01L 21/67051; H01L 21/67069; H01L 21/683; H01L 21/68764; G03F 7/70908; G03F 7/70925
    See application file for complete search history.

(56) References Cited

U.S. PATENT DOCUMENTS

| | | | |
|---|---|---|---|
| 2017/0008044 A1* | 1/2017 | Okumura | G05D 7/0635 |
| 2018/0085795 A1* | 3/2018 | Tsuchihashi | B08B 9/0321 |
| 2018/0369881 A1* | 12/2018 | Saito | C23C 16/4401 |

FOREIGN PATENT DOCUMENTS

| | | |
|---|---|---|
| KR | 10-1168649 B | 7/2012 |
| KR | 1020140008254 A | 1/2014 |
| KR | 10-1521302 B | 5/2015 |
| KR | 1020160057036 A | 5/2016 |
| KR | 10-1634441 B | 6/2016 |

* cited by examiner

P1 < P2

P1 < P2

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2018-0083704 filed on Jul. 18, 2018, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for cleaning a processing vessel.

Various processes, such as photolithography, etching, ashing, thin-film deposition, cleaning, and the like, are performed to manufacture semiconductor devices or flat display panels. Among these processes, the photolithography, etching, ashing, and cleaning processes include a process of treating a substrate with a treating liquid by dispensing the treating liquid onto the substrate.

The photolithography process includes a coating step, an exposing step, and a developing step. The coating step is a coating process of coating a substrate with a light-sensitive liquid such as photoresist, and part of the light-sensitive liquid used is recovered through a processing vessel.

Referring to FIG. 1, a substrate coating apparatus in the related art includes a liquid dispensing member 2, a housing 3, a substrate support member 4, and a processing vessel 5. The substrate support member 4 supports and rotates a substrate W, and the processing vessel 5 surrounds the substrate support member 4. A light-sensitive liquid is dispensed onto the substrate W, and the light-sensitive liquid used is recovered through a recovery line of the processing vessel 5. The light-sensitive liquid, which is a chemical with viscosity, adheres to the inner side of the processing vessel 5 in the recovery process. Due to this, a cleaning process for cleaning the inner side of the processing vessel 5 has to be performed after the performance of the coating process on the substrate W.

The cleaning process is performed by dispensing a cleaning solution toward the center of a rotating substrate W and allowing the dispensed cleaning solution to collide with the processing vessel 5 while being scattered outside the substrate W. However, it is difficult to clean an upper part 6 of the processing vessel 5 by the cleaning process. Furthermore, cleaning efficiency is deteriorated because the cleaning solution applies a collision force to the inner side of the processing vessel 5 only in the horizontal direction.

SUMMARY

Embodiments of the inventive concept provide an apparatus and method for improving cleaning efficiency of a processing vessel.

Embodiments of the inventive concept provide a jig having a new structure that is used to clean a processing vessel.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a method for treating a substrate includes a substrate treating step of treating the substrate by dispensing a treating liquid onto the substrate while rotating the substrate supported on a support plate in a processing space of a processing vessel and a vessel cleaning step of cleaning the processing vessel by dispensing a cleaning solution onto a jig while rotating the jig supported on the support plate. In the substrate treating step, the substrate is clamped to the support plate by a first vacuum pressure applied to the substrate. The vessel cleaning step includes a first clamping step of clamping the jig to the support plate by applying a second vacuum pressure to the jig. The first vacuum pressure and the second vacuum pressure are different from each other.

According to an embodiment, the second vacuum pressure may be higher than the first vacuum pressure.

According to an embodiment, the vessel cleaning step may further include a second clamping step of clamping the jig to the support plate by a third vacuum pressure different from the second vacuum pressure.

According to an embodiment, the third vacuum pressure may be the same as the first vacuum pressure.

According to an embodiment, the first clamping step and the second clamping step may be repeatedly performed during the vessel cleaning step.

According to an embodiment, a relative height between the support plate and the processing vessel may be varied in the vessel cleaning step.

According to an embodiment, the height of the processing vessel may be varied by a motor.

According to an embodiment, the jig may have the same size as the substrate.

According to an exemplary embodiment, a method for treating a substrate includes a substrate treating step of treating the substrate by dispensing a treating liquid onto the substrate while rotating the substrate supported on a support plate in a processing space of a processing vessel and a vessel cleaning step of cleaning the processing vessel by dispensing a cleaning solution onto a jig while rotating the jig supported on the support plate. An edge region of the jig may be upwardly inclined toward the outside while the processing vessel is cleaned in the vessel cleaning step.

According to an embodiment, the support plate may clamp the jig by vacuum pressure in the vessel cleaning step. The jig may be flattened when the vacuum pressure is removed, and the edge region of the jig may be upwardly inclined toward the outside by the vacuum pressure applied to the jig in the vessel cleaning step.

According to an embodiment, the support plate may clamp the substrate by vacuum pressure in the substrate treating step, the vacuum pressure applied to the jig in the vessel cleaning step may be higher than the vacuum pressure applied to the substrate in the substrate treating step.

According to an embodiment, the support plate may clamp and support the substrate or the jig by applying vacuum pressure, and the jig may be provided in a shape in which the edge region is upwardly inclined toward the outside in a state in which the vacuum pressure is removed.

According to an embodiment, the jig may have a central region with elasticity higher than that of the edge region. Both the central region and the edge region may be flat in a state in which the vacuum pressure is removed. The edge region of the jig may be upwardly inclined toward the outside by the vacuum pressure in the vessel cleaning step.

According to an exemplary embodiment, an apparatus for treating a substrate includes a processing vessel having a processing space inside, a substrate support unit that supports and rotates the substrate or a jig in the processing space, a liquid dispensing unit including a treating liquid dispensing member that dispenses a treating liquid for treating the substrate and a cleaning solution dispensing member that dispenses a cleaning solution for cleaning the processing vessel, and a controller that controls the substrate support unit and the liquid dispensing unit. The substrate support unit includes a support plate having a vacuum line formed therein to clamp the substrate by vacuum pressure and a pressure-reducing member that produces the vacuum pressure in the vacuum line. The controller controls the substrate support unit and the liquid dispensing unit to perform a first clamping step of clamping the substrate to the support plate by producing a first vacuum pressure in the vacuum line when treating the substrate by dispensing the treating liquid onto the substrate supported on the substrate support unit and clamping the jig to the support plate by producing a second vacuum pressure different from the first vacuum pressure, in the vacuum line when cleaning the processing vessel by dispensing the cleaning solution onto the jig supported on the substrate support unit.

According to an embodiment, the second vacuum pressure may be higher than the first vacuum pressure.

According to an embodiment, the controller may perform a second clamping step of clamping the jig to the support plate by a third vacuum pressure different from the second vacuum pressure when cleaning the processing vessel by dispensing the cleaning solution onto the jig supported on the substrate support unit.

According to an embodiment, the third vacuum pressure may be the same as the first vacuum pressure.

According to an embodiment, the controller may repeatedly perform the first clamping step and the second clamping step while cleaning the processing vessel by dispensing the cleaning solution onto the jig.

According to an embodiment, the apparatus may further include a lifting unit that adjusts a relative height between the substrate support unit and the processing vessel. The controller may control the lifting unit. The controller may vary the relative height between the substrate support unit and the processing vessel while cleaning the processing vessel by dispensing the cleaning solution onto the jig.

According to an embodiment, the jig may have the same size as the substrate.

According to an embodiment, the support plate may have a smaller size than the substrate.

According to an exemplary embodiment, a jig is supported on a substrate support unit in a processing vessel and used to clean the processing vessel in an apparatus that treats a substrate supported on the substrate support unit by dispensing a treating liquid onto the substrate. The jig has a central region with elasticity higher than that of an edge region.

According to an embodiment, the central region of the jig may be thinner than the edge region of the jig.

According to an embodiment, the jig may include a central plate made of a first material and an edge plate that is combined with the central plate and that is made of a second material having elasticity lower than that of the first material.

According to an exemplary embodiment, a jig supported on a substrate support unit in a processing vessel and used to clean the processing vessel in an apparatus that treats a substrate supported on the substrate support unit by dispensing a treating liquid onto the substrate includes a flat central region and an upwardly inclined edge region extending from the central region to the outside.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
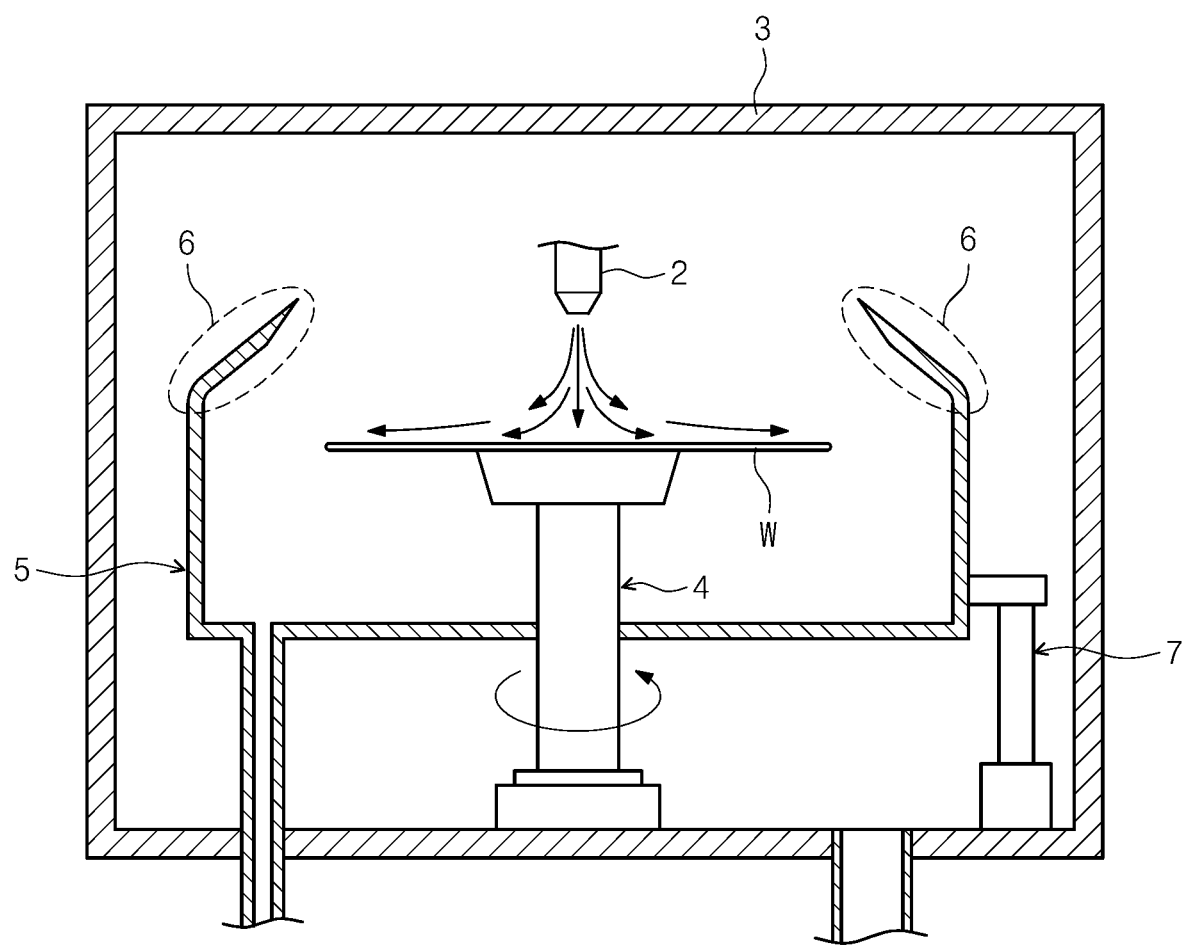
FIG. 1 is a sectional view illustrating a substrate treating apparatus in the related art.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Equipment according to this embodiment may be used to perform a photolithography process on a substrate such as a semiconductor wafer or a flat display panel. In particular, the equipment according to this embodiment may be connected to a stepper and may be used to perform a coating process and a developing process on the substrate. In the following description, it will be exemplified that a wafer is used as the substrate.

Hereinafter, the substrate treating equipment of the inventive concept will be described with reference to FIGS. 2 to 6.

Figure 2:
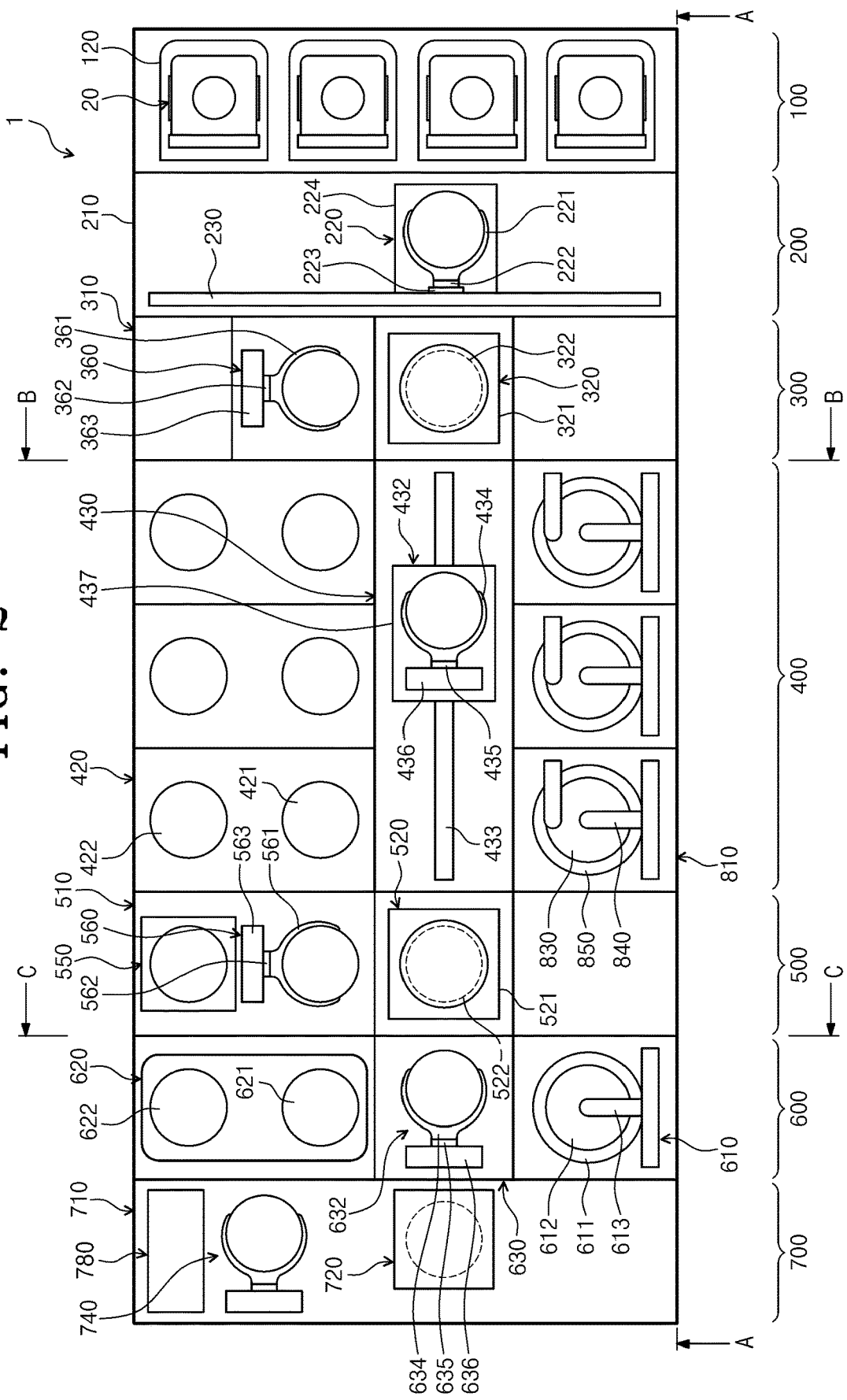
FIG. 2 is a top view illustrating substrate treating equipment according to an embodiment of the inventive concept.
Figure 3:
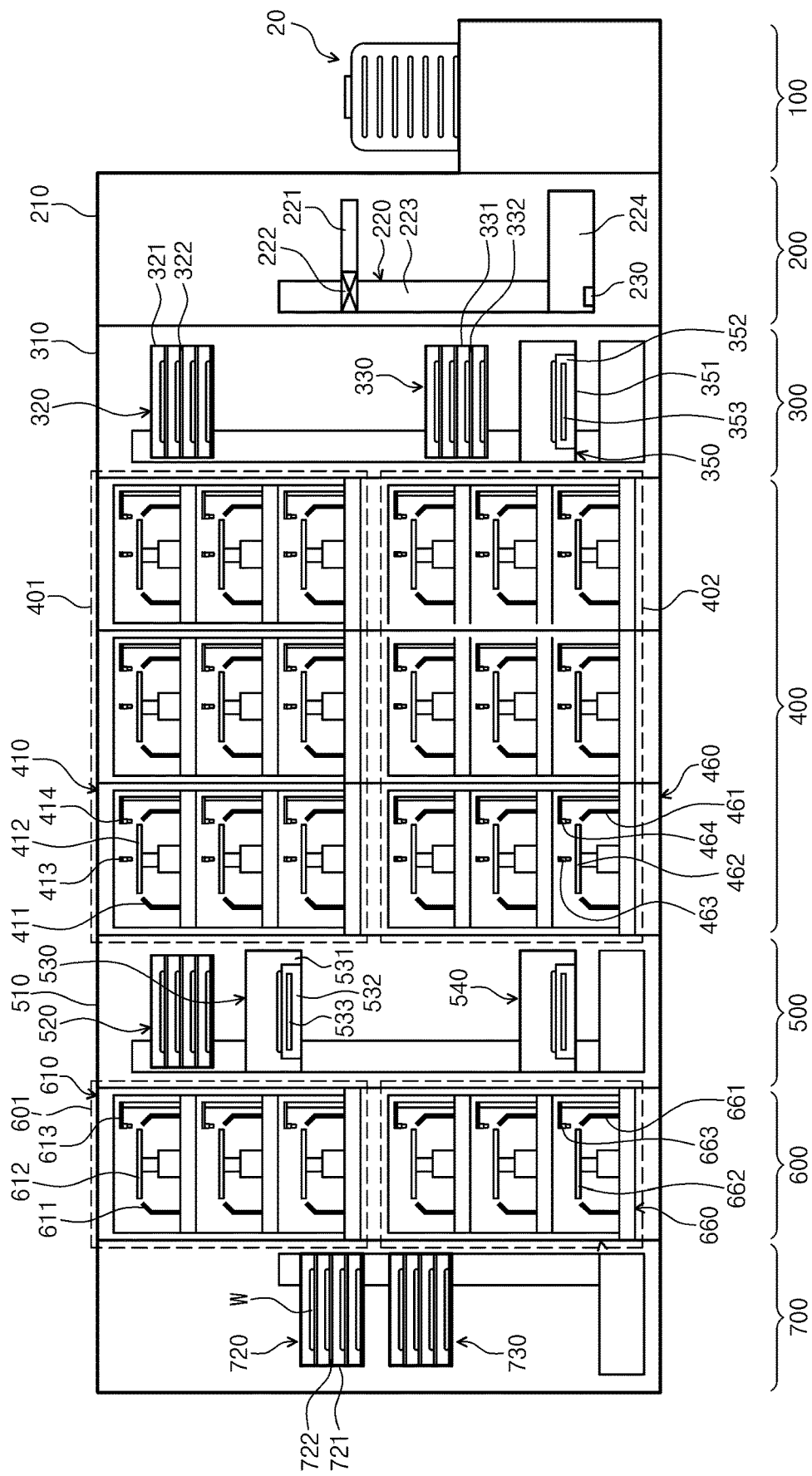
FIG. 3 is a sectional view illustrating the equipment of FIG. 2 when viewed in direction A-A.
Figure 4:
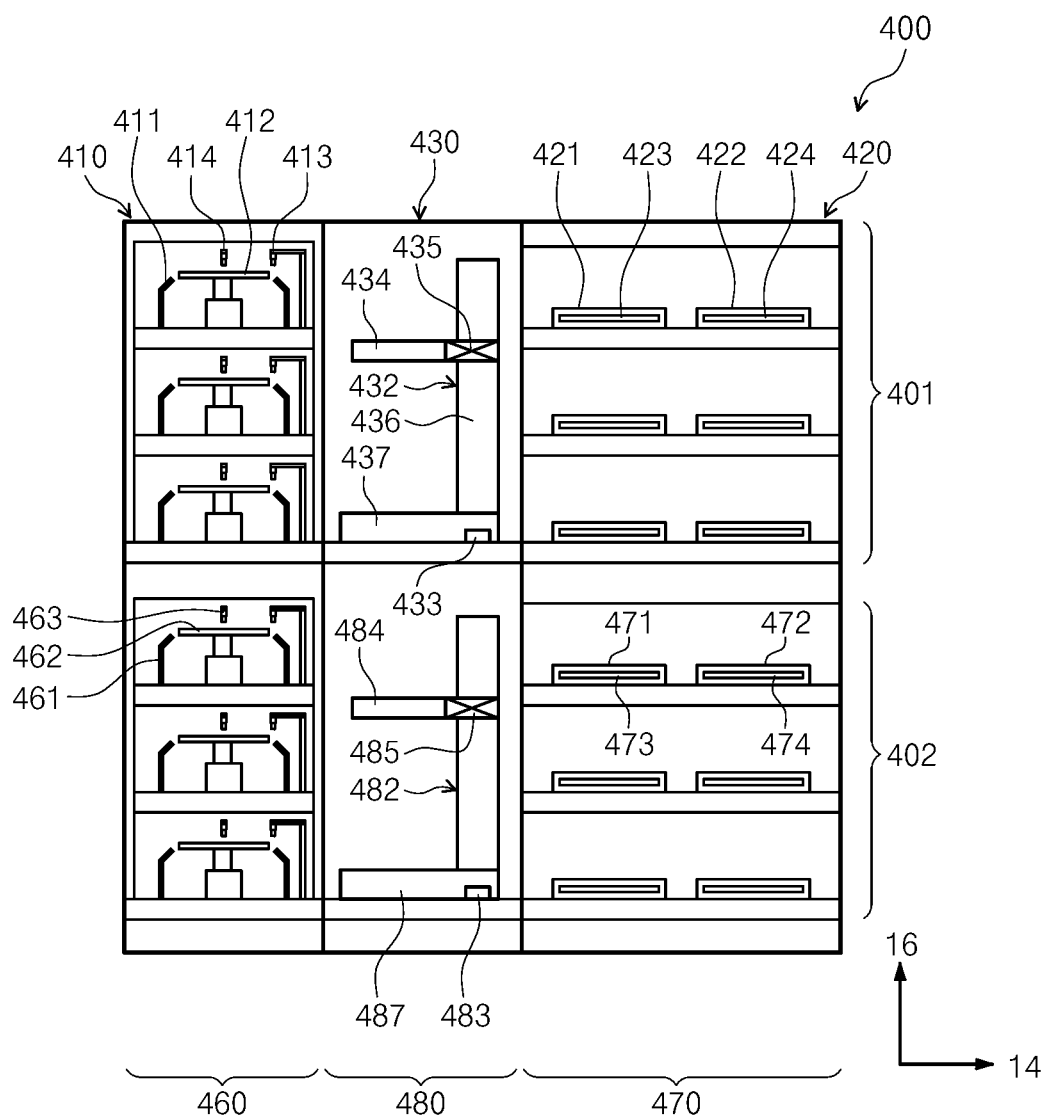
FIG. 4 is a sectional view illustrating the equipment of FIG. 2 when viewed in direction B-B.
Figure 5:
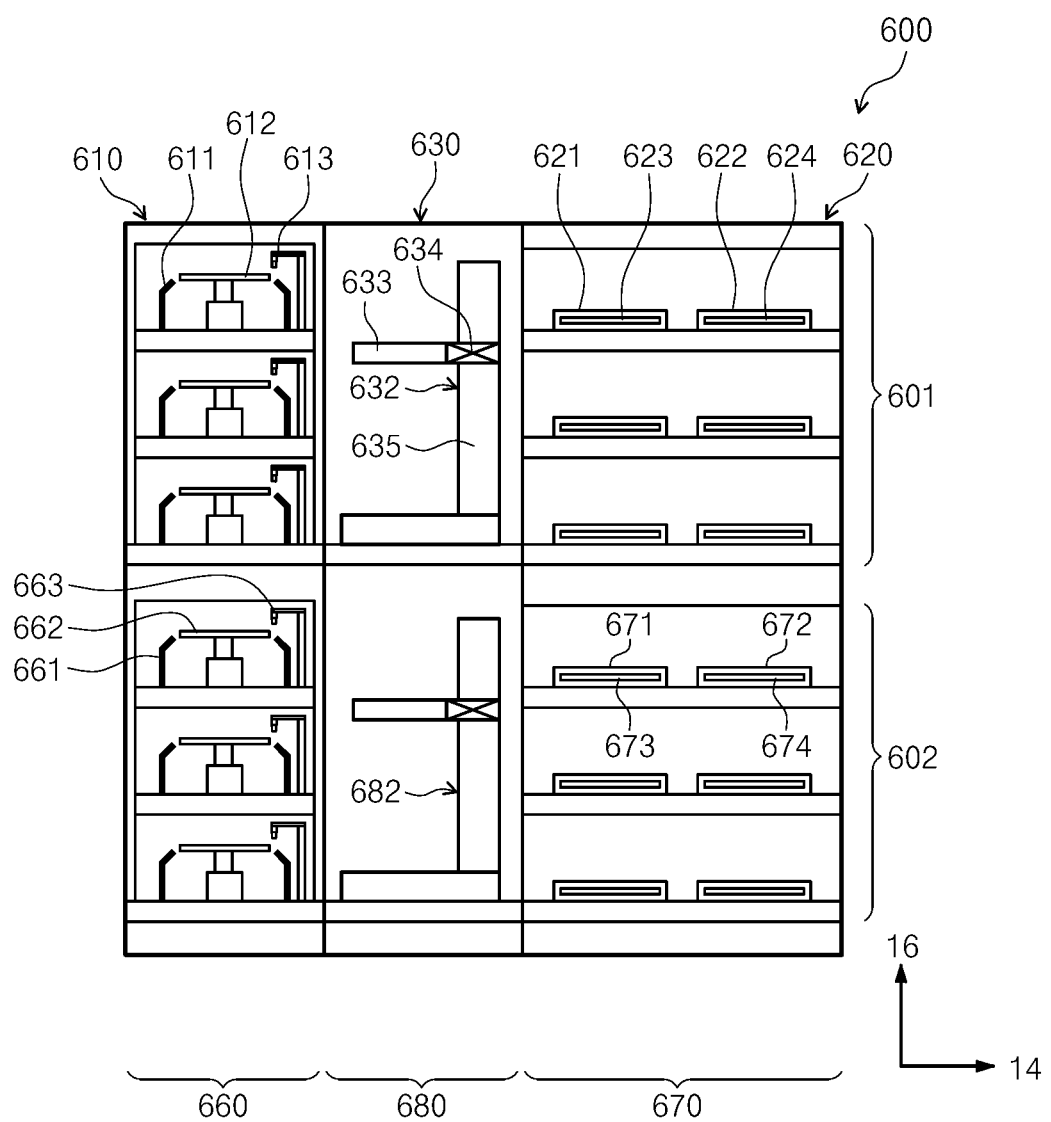
FIG. 5 is a sectional view illustrating the equipment of FIG. 2 when viewed in direction C-C.

FIG. 2 is a top view illustrating the substrate treating equipment according to an embodiment of the inventive concept. FIG. 3 is a view illustrating the equipment of FIG. 2 when viewed in direction A-A. FIG. 4 is a view illustrating the equipment of FIG. 2 when viewed in direction B-B. FIG. 5 is a view illustrating the equipment of FIG. 2 when viewed in direction C-C.

Referring to FIGS. 2 to 5, the substrate treating equipment 1 includes a load port 100, an index module 200, a first buffer module 300, a coating and developing module 400, a second buffer module 500, a pre/post-exposure treating module 600, and an interface module 700. The load port 100, the index module 200, the first buffer module 300, the coating and developing module 400, the second buffer module 500, the pre/post-exposure treating module 600, and the interface module 700 are sequentially arranged in a row in one direction.

Hereinafter, a first direction 12 refers to the direction in which the load port 100, the index module 200, the first buffer module 300, the coating and developing module 400, the second buffer module 500, the pre/post-exposure treating module 600, and the interface module 700 are arranged. A second direction 14 refers to a direction that is perpendicular to the first direction 12 when viewed from above, and a third direction 16 refers to a direction that is perpendicular to the first direction 12 and the second direction 14.

Substrates W are moved in the state of being received in cassettes 20. The cassettes 20 have a structure that can be sealed from the outside. For example, front open unified pods (FOUPs), each of which has a door at the front thereof, may be used as the cassettes 20. Hereinafter, the load port 100, the index module 200, the first buffer module 300, the coating and developing module 400, the second buffer module 500, the pre/post-exposure treating module 600, and the interface module 700 will be described in detail.

The load port 100 has mounting tables 120 on which the cassettes 20 having the substrates W received therein are placed. The mounting tables 120 are arranged in a row along the second direction 14. In FIG. 2, four mounting tables 120 are provided. The index module 200 transfers the substrates W between the cassettes 20 placed on the mounting tables 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may be located in a lower position than a frame 310 of the first buffer module 300 that will be described below. The index robot 220 and the guide rail 230 are disposed in the frame 210. The index robot 220 has a structure that enables 4-axis driving to allow a hand 221 directly handling the substrate W to move and rotate in the first direction 12, the second direction 14, and the third direction 16. The index robot 220 has the hand 221, an arm 222, a support rod 223, and a base 224. The hand 221 is fixedly attached to the arm 222. The arm 222 is provided in a retractable structure and a rotatable structure. The support rod 223 is arranged such that the lengthwise direction thereof is parallel to the third direction 16. The arm 222 is combined with the support rod 223 so as to be movable along the support rod 223. The support rod 223 is fixedly combined with the base 224. The guide rail 230 is arranged such that the lengthwise direction thereof is parallel to the second direction 14. The base 224 is combined with the guide rail 230 so as to be movable along the guide rail 230. Furthermore, although not illustrated, a door opener for opening/closing the doors of the cassettes 20 is additionally provided.

The first buffer module 300 has the frame 310, a first buffer 320, a second buffer 330, a cooling chamber 350, and a first buffer robot 360. The frame 310 has a rectangular parallelepiped shape with an empty space inside. The frame 310 is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially arranged along the third direction 16 from bottom to top. The first buffer 320 is located at the height corresponding to a coating module 401 of the coating and developing module 400 that will be described below, and the second buffer 330 and the cooling chamber 350 are located at the height corresponding to a developing module 402 of the coating and developing module 400 that will be described below. The first buffer robot 360 is spaced apart from the second buffer 330, the cooling chamber 350, and the first buffer 320 by a predetermined distance in the second direction 14.

The first buffer 320 and the second buffer 330 each temporarily store a plurality of substrates W. The second buffer 330 has a housing 331 and a plurality of supports 332. The supports 332 are disposed in the housing 331 and are spaced apart from each other along the third direction 16. One substrate W is placed on each of the supports 332. The housing 331 has openings (not illustrated) that face the directions in which the index robot 220, the first buffer robot 360, and a developer robot 482 are provided, such that the index robot 220, the first buffer robot 360, and the developer robot 482 of the developing module 402, which will be described below, load the substrates W onto the supports 332 or unload the substrates W from the supports 332. The first buffer 320 has a structure substantially similar to that of the second buffer 330. However, a housing 321 of the first buffer 320 has openings that face the directions in which the first buffer robot 360 and a transfer robot 432 located in the coating module 401 are provided. The number of supports 332 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320. The first buffer robot 360 transfers the substrates W between the first buffer 320 and the second buffer 330.

The first buffer robot 360 has a hand 361, an arm 362, and a support rod 363. The hand 361 is fixedly attached to the arm 362. The arm 362 has a retractable structure to enable the hand 361 to move along the second direction 14. The arm 362 is combined with the support rod 363 so as to be linearly movable along the support rod 363 in the third direction 16. The support rod 363 has a length extending from the position corresponding to the second buffer 330 to the position corresponding to the first buffer 320. The support rod 363 may further extend in the upper or lower direction. The first buffer robot 360 may allow the hand 361 to perform only 2-axis driving along the second direction 14 and the third direction 16.

The cooling chamber 350 cools each of the substrates W. The cooling chamber 350 has a housing 351 and a cooling plate 352. The cooling plate 352 has an upper surface on which the substrate W is placed and a cooling unit 353 that cools the substrate W. Various methods, such as cooling by cooling water, cooling using a thermoelectric element, or the like, may be used for the cooling unit 353. Furthermore, the cooling chamber 350 may include a lift pin assembly (not illustrated) that locates the substrate W on the cooling plate 352. The housing 351 has openings (not illustrated) that face the directions in which the index robot 220 and the developer robot 482 are provided, such that the index robot 220 and the developer robot 482 provided in the developing module 402 load the substrate W onto the cooling plate 352 or unload the substrate W from the cooling plate 352.

Furthermore, the cooling chamber 350 may include doors (not illustrated) that open or close the openings described above.

The coating and developing module 400 performs a process of coating the substrates W with photoresist before an exposing process and performs a developing process on the substrates W after the exposing process. The coating and developing module 400 has a substantially rectangular parallelepiped shape. The coating and developing module 400 has the coating module 401 and the developing module 402. The coating module 401 and the developing module 402 are disposed on different floors. According to an embodiment, the coating module 401 is located over the developing module 402.

The coating module 401 performs a process of coating the substrates W with a light-sensitive liquid such as photoresist and performs a heat treatment process such as heating or cooling the substrates W before and after the photoresist coating process. The coating module 401 has resist coating chambers 410, bake chambers 420, and a transfer chamber 430. The resist coating chambers 410, the transfer chamber 430, and the bake chambers 420 are sequentially arranged along the second direction 14. Accordingly, the resist coating chambers 410 and the bake chambers 420 are spaced apart from each other in the second direction 14, with the transfer chamber 430 therebetween. The resist coating chambers 410 are arranged in the first direction 12 and the third direction 16. The drawings illustrate an example that six resist coating chambers 410 are provided. The bake chambers 420 are arranged in the first direction 12 and the third direction 16. The drawings illustrate an example that six bake chambers 420 are provided. However, a larger number of bake chambers 420 may be provided.

The transfer chamber 430 is located side by side with the first buffer 320 of the first buffer module 300 in the first direction 12. The transfer robot 432 and a guide rail 433 are located in the transfer chamber 430. The transfer chamber 430 has a substantially rectangular shape. The transfer robot 432 transfers the substrates W between the bake chambers 420, the resist coating chambers 400, the first buffer 320 of the first buffer module 300, and a first cooling chamber 520 of the second buffer module 500 that will be described below. The guide rail 433 is arranged such that the lengthwise direction thereof is parallel to the first direction 12. The guide rail 433 guides a linear movement of the transfer robot 432 in the first direction 12. The transfer robot 432 has a hand 434, an arm 435, a support rod 436, and a base 437. The hand 434 is fixedly attached to the arm 435. The arm 435 has a retractable structure to enable the hand 434 to move in the horizontal direction. The support rod 436 is arranged such that the lengthwise direction thereof is parallel to the third direction 16. The arm 435 is combined with the support rod 436 so as to be linearly movable along the support rod 463 in the third direction 16. The support rod 436 is fixedly combined with the base 437, and the base 437 is combined with the guide rail 433 so as to be movable along the guide rail 433.

The resist coating chambers 410 all have the same structure. However, the types of photoresists used in the respective resist coating chambers 410 may differ from one another. For example, chemical amplification resist may be used as photoresist. The resist coating chambers 410 are provided as substrate treating apparatuses that coat the substrates W with photoresist.

Figure 6:
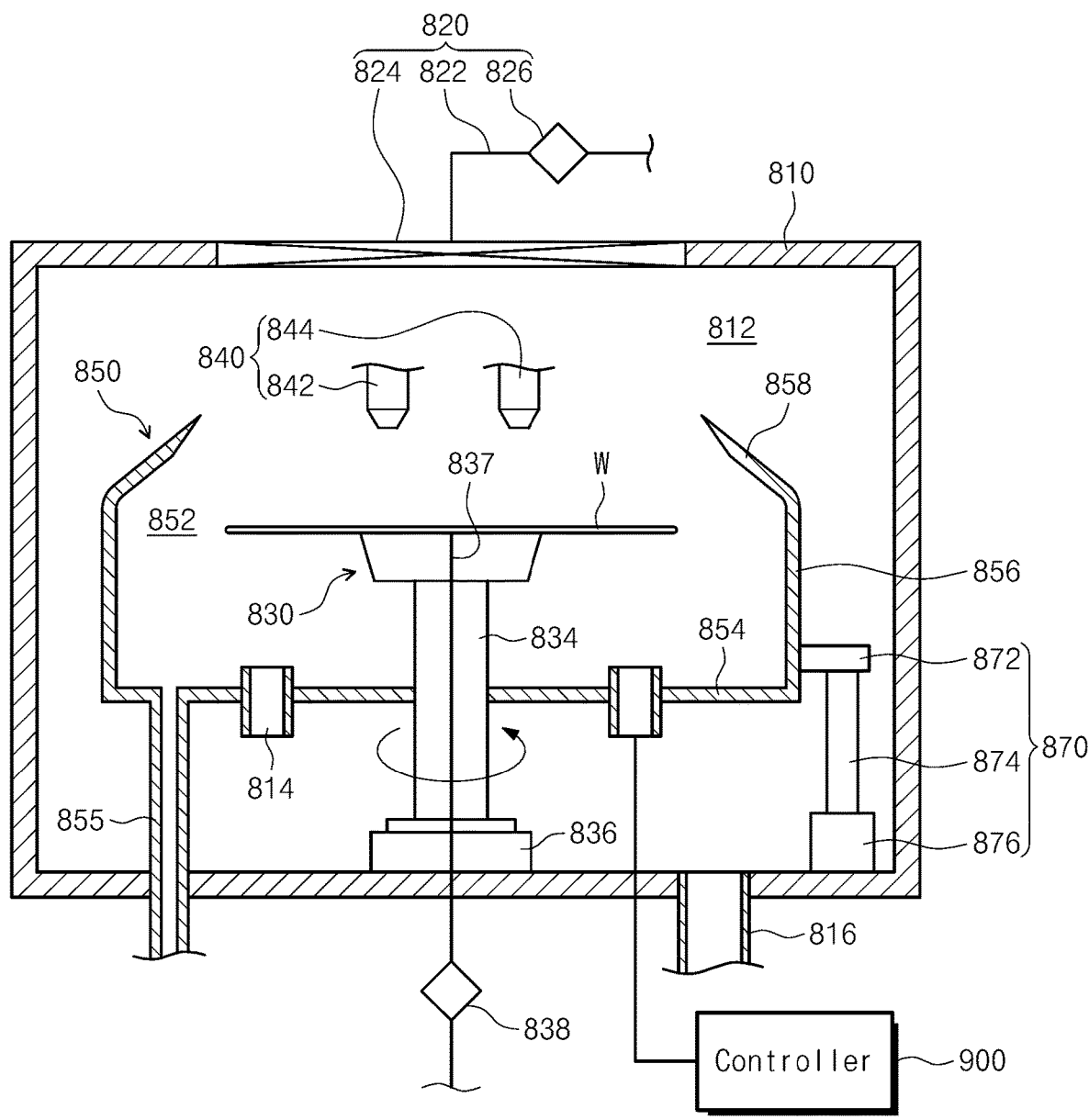
FIG. 6 is a sectional view illustrating a coating chamber of FIG. 2.

FIG. 6 is a sectional view illustrating the coating chamber of FIG. 2.

Referring to FIG. 6, a substrate treating apparatus 800 provided in the coating chamber 410 performs a liquid coating process. The substrate treating apparatus 800 includes a housing 810, an air flow supply unit 820, a substrate support unit 830, a liquid dispensing unit 840, a processing vessel 850, a lifting unit 870, and a controller 900.

The housing 810 has a rectangular parallelepiped container shape with a space 812 inside. The housing 810 has an opening (not illustrated) at one side thereof. The opening functions as an entrance through which a substrate W is placed in or extracted from the housing 810. A door (not illustrated) is provided in the opening. The door opens or closes the opening. When a substrate treating process is performed, the door closes the opening to seal the inner space 812 of the housing 810 from the outside. The housing 810 has an outer exhaust port 816 formed at the bottom thereof, and the processing vessel 850 has an inner exhaust port 814 formed at the bottom thereof. An air flow formed in the housing 810 is discharged to the outside through the inner exhaust port 814 and the outer exhaust port 816. According to an embodiment, an air flow inside the processing vessel 850 may be released through the inner exhaust port 814, and an air flow outside the processing vessel 850 may be discharged through the outer exhaust port 816.

The air flow supply unit 820 forms a downward flow of air in the inner space 812 of the housing 810. The air flow supply unit 820 includes an air flow supply line 822, a fan 824, and a filter 826. The air flow supply line 822 is connected to the housing 810. The air flow supply line 822 supplies outside air into the housing 810. The filter 826 filters the air supplied from the air flow supply line 822. The filter 826 removes impurities contained in the air. The fan 824 is installed in an upper wall of the housing 810. The fan 824 is located in the central region of the upper wall of the housing 810. The fan 824 forms a downward air flow in the inner space 812 of the housing 810. When the air is supplied from the air flow supply line 822 to the fan 824, the fan 824 supplies the air downward.

The substrate support unit 830 supports the substrate W in the inner space 812 of the housing 810. The substrate support unit 830 rotates the substrate W. The substrate support unit 830 includes a support plate 832, a rotary shaft 834, and an actuator 836. The support plate 832 has a circular plate shape. The substrate W is placed on an upper surface of the support plate 832. The support plate 832 has a smaller diameter than the substrate W. According to an embodiment, a vacuum line 837 may be provided in the support plate 832 to cause the support plate 832 to clamp the substrate W by vacuum pressure. A pressure-reducing member 838 that produces vacuum pressure may be installed on the vacuum line 837. Accordingly, the support plate 832 may clamp the substrate W by the vacuum pressure. The substrate W may be located such that the central axis of the substrate W is aligned with the central axis of the support plate 832 when viewed from above. Alternatively, the support plate 832 may clamp the substrate W using a physical force. The rotary shaft 834 may support the bottom of the support plate 832. The rotary shaft 834 may be arranged such that the lengthwise direction thereof is parallel to the vertical direction. The rotary shaft 834 is rotatable about the central axis thereof. The actuator 836 may apply a driving force to rotate the rotary shaft 834. For example, the actuator 836 may be a motor.

The liquid dispensing unit 840 dispenses a treating liquid and a cleaning solution onto the substrate W. The liquid dispensing unit 840 may include a treating liquid dispensing member 842 and a cleaning solution dispensing member 844. The treating liquid may be a light-sensitive liquid such as photoresist, and the cleaning solution may be thinner. The treating liquid dispensing member 842 and the cleaning solution dispensing member 844 may dispense the treating liquid and the cleaning solution in a central position. Here, the central position may be a position in which the liquid dispensing members 842 and 844 face the central region of the substrate W.

The processing vessel 850 is located in the inner space 812 of the housing 810. The processing vessel 850 has a processing space 852 inside. The processing vessel 850 has a cup shape that is open at the top thereof. The processing vessel 850 may surround the substrate support unit 830. The processing vessel 850 includes a lower part 854, a side part 856, and an upper part 858. The lower part 854 has a circular plate shape with an opening.

A recovery line 855 is formed on the lower part 854. The recovery line 855 may deliver the treating liquid and the cleaning solution recovered through the processing space 852, to an external liquid regeneration system (not illustrated). The side part 856 has a cylindrical shape with an empty space inside. The side part 856 vertically extends from a side end of the lower part 854. The side part 856 extends upward from the lower part 854. The upper part 858 extends from an upper end of the side part 856. The upper part 858 may be upwardly inclined toward the substrate support unit 830.

The lifting unit 870 adjusts the relative height between the substrate support unit 830 and the processing vessel 850. The lifting unit 870 raises or lowers the processing vessel 850. The lifting unit 870 includes a bracket 872, a movable shaft 874, and an actuator 876. The actuator 876 may be a motor. The bracket 872 is fixedly attached to the side part 856 of the processing vessel 850. The movable shaft 874 supports the bracket 872. The movable shaft 874 is arranged such that the lengthwise direction thereof is parallel to the vertical direction. The actuator 876 moves the movable shaft 874 in the vertical direction. Accordingly, the bracket 872 and the processing vessel 850 are movable in the vertical direction.

The controller 900 may control the substrate support unit 830, the liquid dispensing unit 840 and the lifting unit 870 to perform a substrate treating step and a vessel cleaning step that will be described below.

Next, a method of treating the substrate W using the above-described substrate treating apparatus will be described. The substrate treating method may include a substrate treating step of treating the substrate W by dispensing the treating liquid onto the substrate W while rotating the substrate W supported on the support plate 832 in the processing space 852 of the processing vessel 850 and a vessel cleaning step of cleaning the processing vessel 850 by dispensing the cleaning solution onto a jig G supported on the support plate 832. In the following description, it will be exemplified that the substrate W and the jig G have the same size.

Figure 7A:
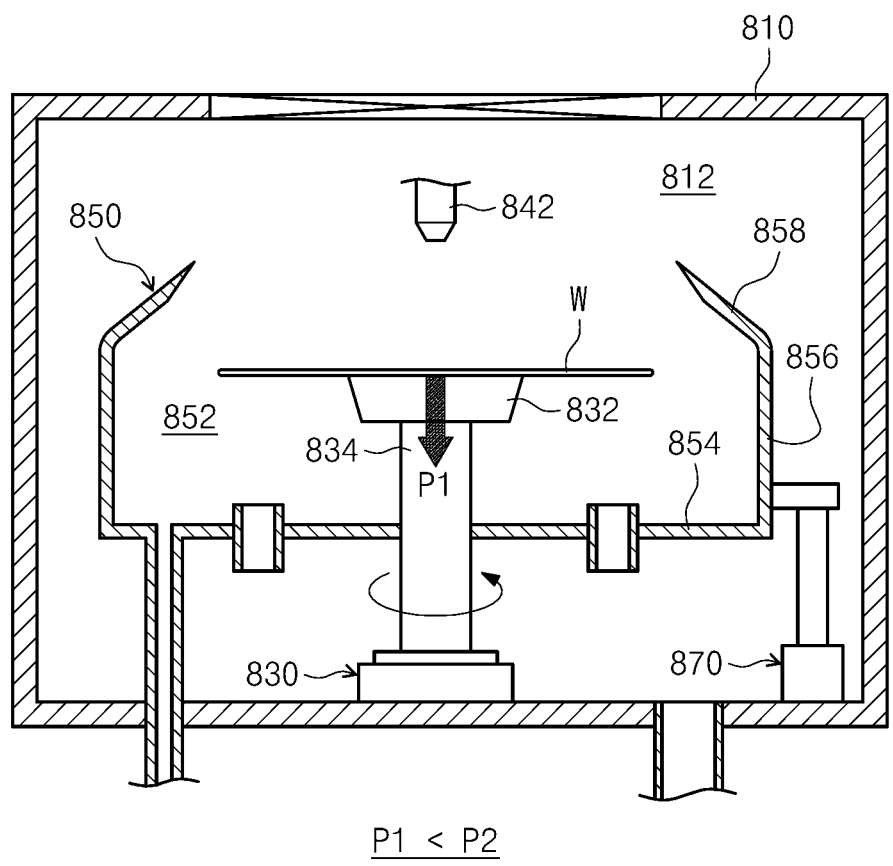
FIGS. 7A and 7B are sectional views illustrating a substrate treating step and a vessel cleaning step, respectively, according to an embodiment of the inventive concept.
Figure 7B:
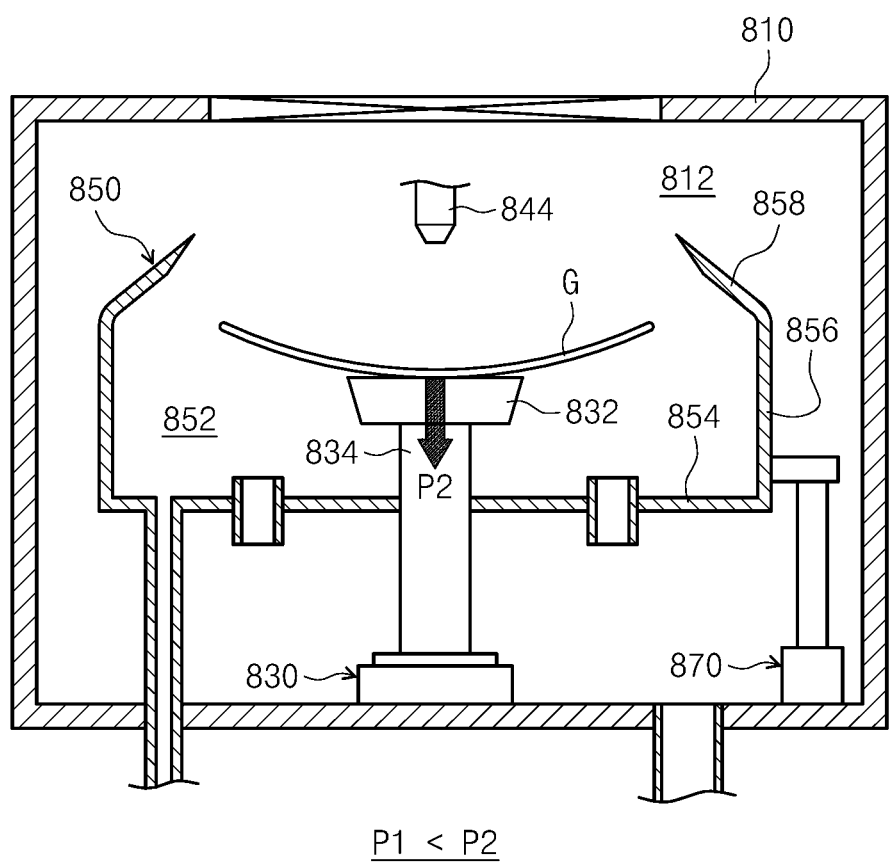

FIGS. 7A and 7B are sectional views illustrating a substrate treating step and a vessel cleaning step, respectively, according to an embodiment of the inventive concept.

Referring to FIG. 7A, in the substrate treating step, the substrate W may be loaded onto the support plate 832 by the transfer robot 432. When loading the substrate W onto the support plate 832, the transfer robot 432 may transfer the substrate W such that the center of the substrate W is aligned with the center of the support plate 832.

The support plate 832 may apply vacuum pressure to the substrate W. Accordingly, the substrate W may be clamped to the support plate 832 by the vacuum pressure. The vacuum pressure may be a first vacuum pressure P1. The first vacuum pressure P1 is a pressure sufficient to prevent the substrate W from escaping from the support plate 832 even though the substrate W is rotated. Furthermore, the first vacuum pressure P1 is a pressure by which deformation of the substrate W is not caused.

The substrate W is rotated by the substrate support unit 830. In the central position, the treating liquid dispensing member 842 dispenses the treating liquid onto the substrate W. The treating liquid may be a light-sensitive liquid such as photoresist. The treating liquid dispensed onto the central region of the top side of the substrate W is applied to the edge region of the substrate W by the rotation of the substrate W. When the process of coating the substrate W with the treating liquid is completely performed, a process of cleaning the processing vessel 850 may be performed.

Referring to FIG. 7B, in the vessel cleaning step, the jig G that is to be used to clean the processing vessel 850 may be loaded onto the support plate 832 by the transfer robot 432. When loading the jig G onto the support plate 832, the transfer robot 432 may transfer the jig G such that the center of the jig G is aligned with the center of the support plate 832.

The support plate 832 may apply vacuum pressure to the jig G. Accordingly, the jig G may be clamped to the support plate 832 by the vacuum pressure. The vacuum pressure may be a second vacuum pressure P2 different from the first vacuum pressure P1. The second vacuum pressure P2 may be higher than the first vacuum pressure P1.

The jig G may be flat when the first vacuum pressure P1 is applied to the support plate 832 or when the vacuum pressure is removed. The jig G may be deformed by the second vacuum pressure P2 such that the edge region of the jig G is upwardly inclined toward the outside. While the processing vessel 850 is cleaned in the vessel cleaning step, the jig G may be maintained in the state in which the edge region of the jig G is upwardly inclined toward the outside.

Figure 8:
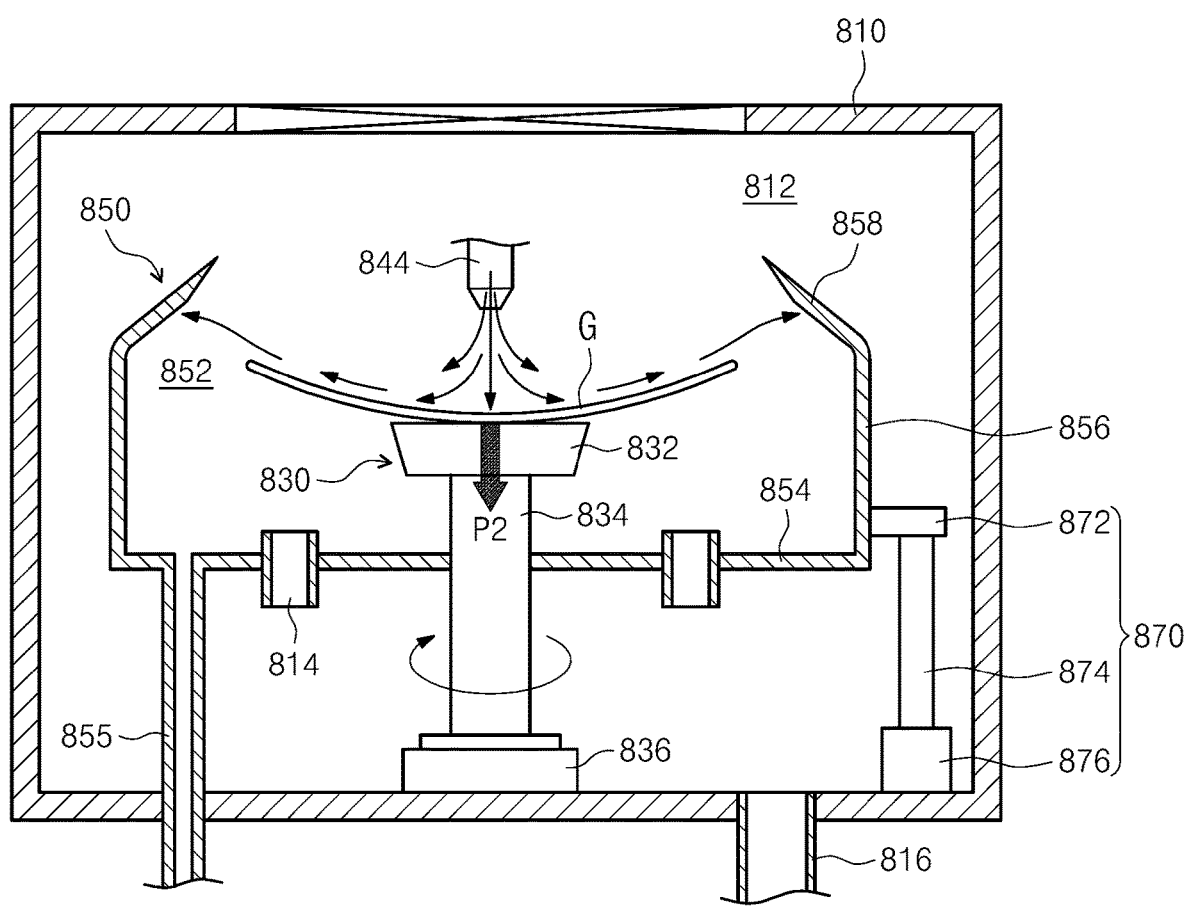
FIG. 8 is a sectional view illustrating one embodiment in which a processing vessel is cleaned in a vessel cleaning step.

FIG. 8 is a sectional view illustrating one embodiment in which the processing vessel is cleaned in the vessel cleaning step. Referring to FIG. 8, the support plate 832 may apply the second vacuum pressure P2 to the jig G in the vessel cleaning step. When the second vacuum pressure P2 is applied to the jig G, the edge region of the jig G may be upwardly inclined toward the outside. The jig G may be rotated by the support plate 832. When the cleaning solution dispensing member 844 dispenses the cleaning solution onto the central area of the top side of the rotating jig G, the cleaning solution may be scattered over the edge region of the jig G. The cleaning solution scattered from the jig G may be scattered in an upwardly inclined direction along a path that is upwardly inclined toward the outside. The scattered cleaning solution may collide with the inner side of the upper part 858 of the processing vessel 850. The cleaning solution colliding with the upper part 858 may remove the treating liquid adhering to the inner side of the upper part 858.

Furthermore, the upwardly inclined angle of the edge region of the jig G may be decreased by adjusting the second vacuum pressure P2 applied in the vessel cleaning step. In this case, the cleaning solution dispensed onto the rotating jig G may collide with the side part 856 of the processing vessel 850.

According to an embodiment of the inventive concept, the jig G may be deformed by applying the second vacuum pressure P2, which is a high vacuum pressure, to the jig G. Therefore, the scattering path of the cleaning solution dispensed onto the jig G may be varied. Accordingly, the point where the cleaning solution collides with the inner side of the processing vessel 850 may be varied. The cleaning solution may apply a vertical collision force together with a horizontal collision force while colliding with the inner side of the processing vessel 850 in the upwardly inclined direction. Thus, the efficiency of the cleaning process for the processing vessel 850 may be increased.

The jig G used in the vessel cleaning step may have the same size as the substrate W treated in the substrate treating step. Accordingly, the cleaning region of the processing vessel 850 may be enlarged without a change in the system of the substrate treating apparatus that is set according to the substrate W.

Figure 9:
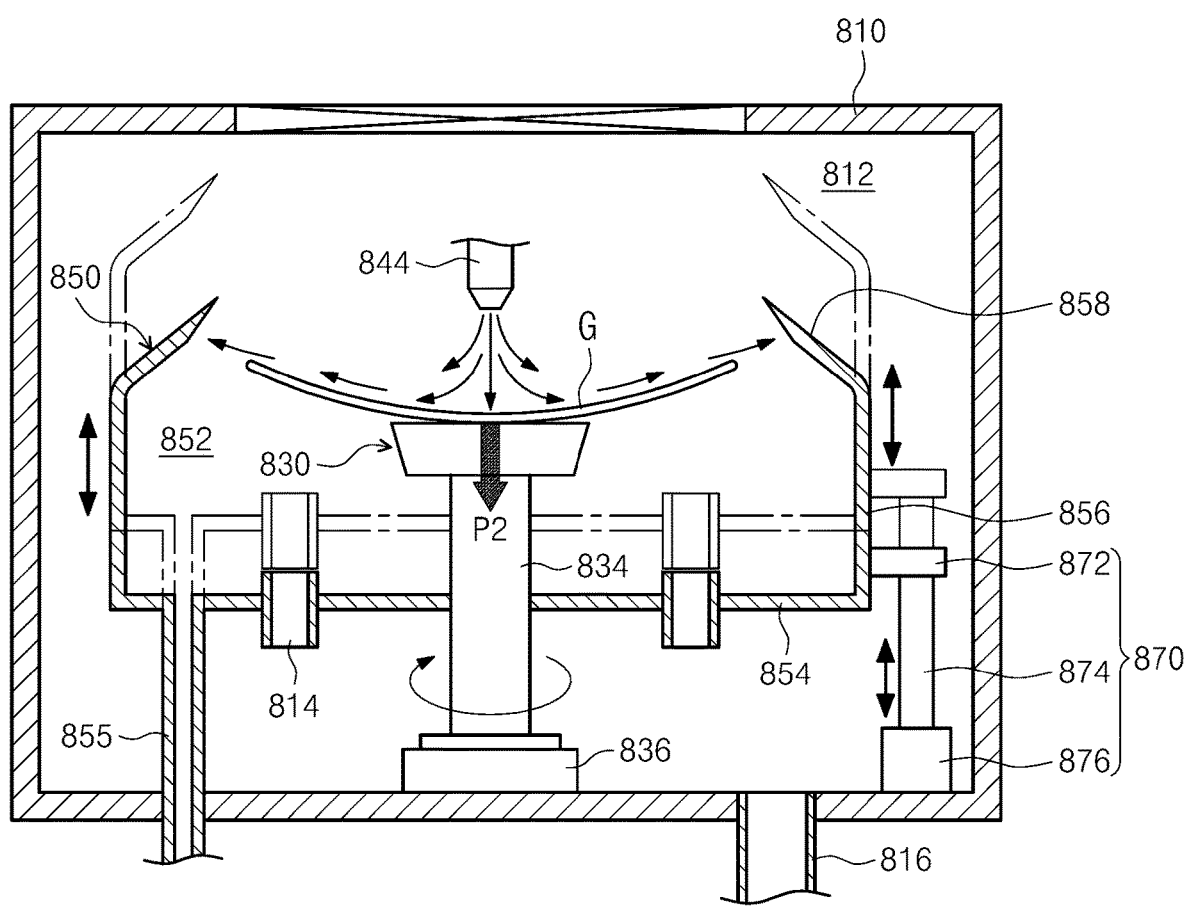
FIG. 9 is a sectional view illustrating another embodiment in which a processing vessel is cleaned in a vessel cleaning step.

FIG. 9 is a sectional view illustrating another embodiment in which the processing vessel is cleaned in the vessel cleaning step. Referring to FIG. 9, in the vessel cleaning step, the lifting unit 870 may vary the relative height between the support plate 832 and the processing vessel 850. The actuator 876 of the lifting unit 870 may be a motor. The relative height variation may be achieved by varying the height of the processing vessel 850 by the motor. Unlike a hydraulic machine, the motor is capable of finely adjusting the height of the processing vessel 850. Therefore, the height of the processing vessel 850 may be varied slowly. Thus, the cleaning efficiency of the processing vessel 850 may be improved. In addition, the cleaning region may be widened with the variation in the relative height between the processing vessel 850 and the support plate 832 during the performance of the vessel cleaning step. For example, the treating liquid adhering to the inner sides of the side part 856 and the upper part 858 of the processing vessel 850 may be cleaned.

Figure 10:
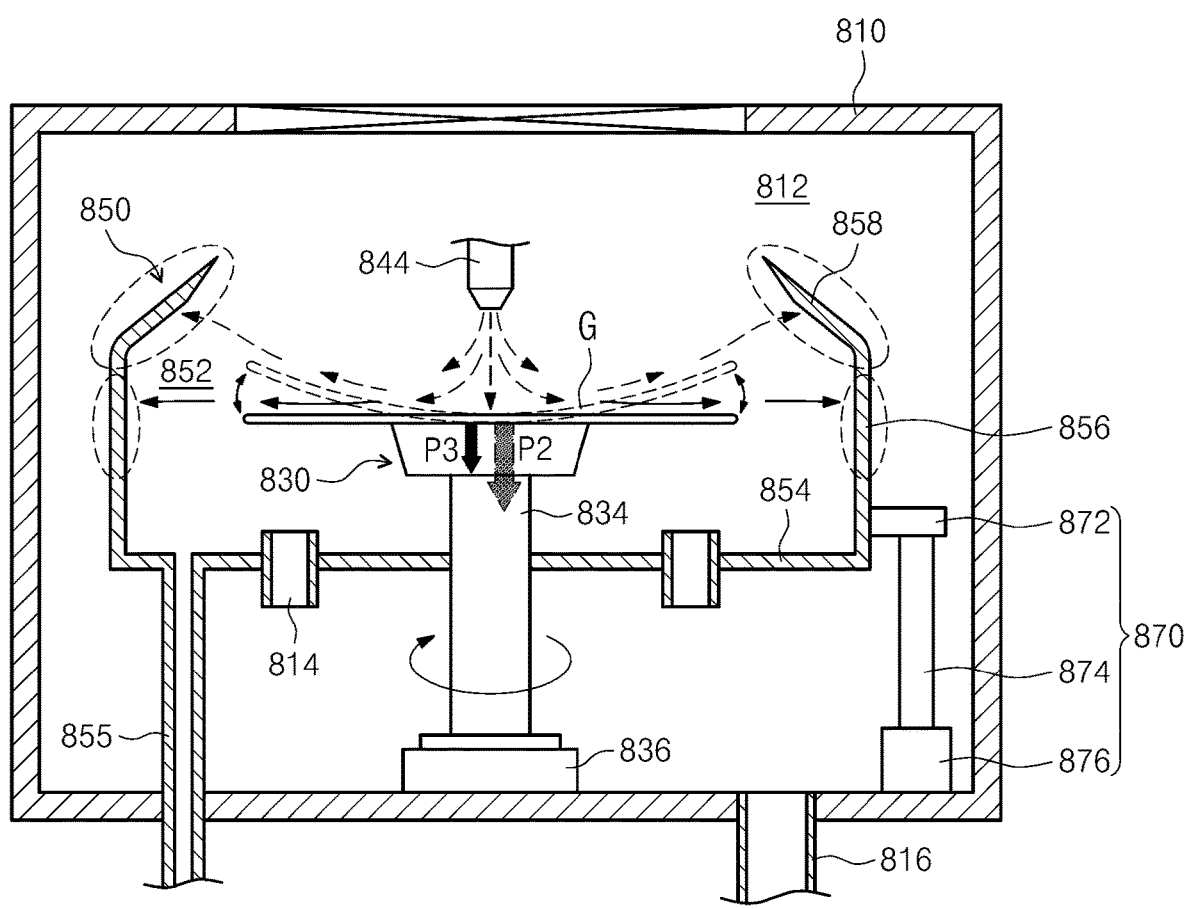
FIG. 10 is a sectional view illustrating another embodiment in which a processing vessel is cleaned in a vessel cleaning step.

FIG. 10 is a sectional view illustrating another embodiment in which the processing vessel is cleaned in the vessel cleaning step. Referring to FIG. 10, the vessel cleaning step may include a first clamping step of clamping the jig G to the support plate 832 by the second vacuum pressure P2 and a second clamping step of clamping the jig G to the support plate 832 by a third vacuum pressure P3. The third vacuum pressure P3 may be the same as the first vacuum pressure P1. When the second vacuum pressure P2 is applied to the jig G, the edge region of the jig G may be upwardly inclined toward the outside. When the third vacuum pressure P3 is applied to the jig G, the jig G may be flattened.

The first clamping step and the second clamping step may be repeatedly performed during the vessel cleaning step. Therefore, the jig G may be repeatedly deformed into a flat shape or a shape in which the edge region is upwardly inclined toward the outside. Accordingly, the cleaning solution dispensed onto the rotating jig G may be scattered in various directions. Thus, the cleaning region of the processing vessel 850 may be widened. For example, the treating liquid adhering to the inner sides of the side part 856 and the upper part 858 of the processing vessel 850 may be cleaned.

Figure 11:
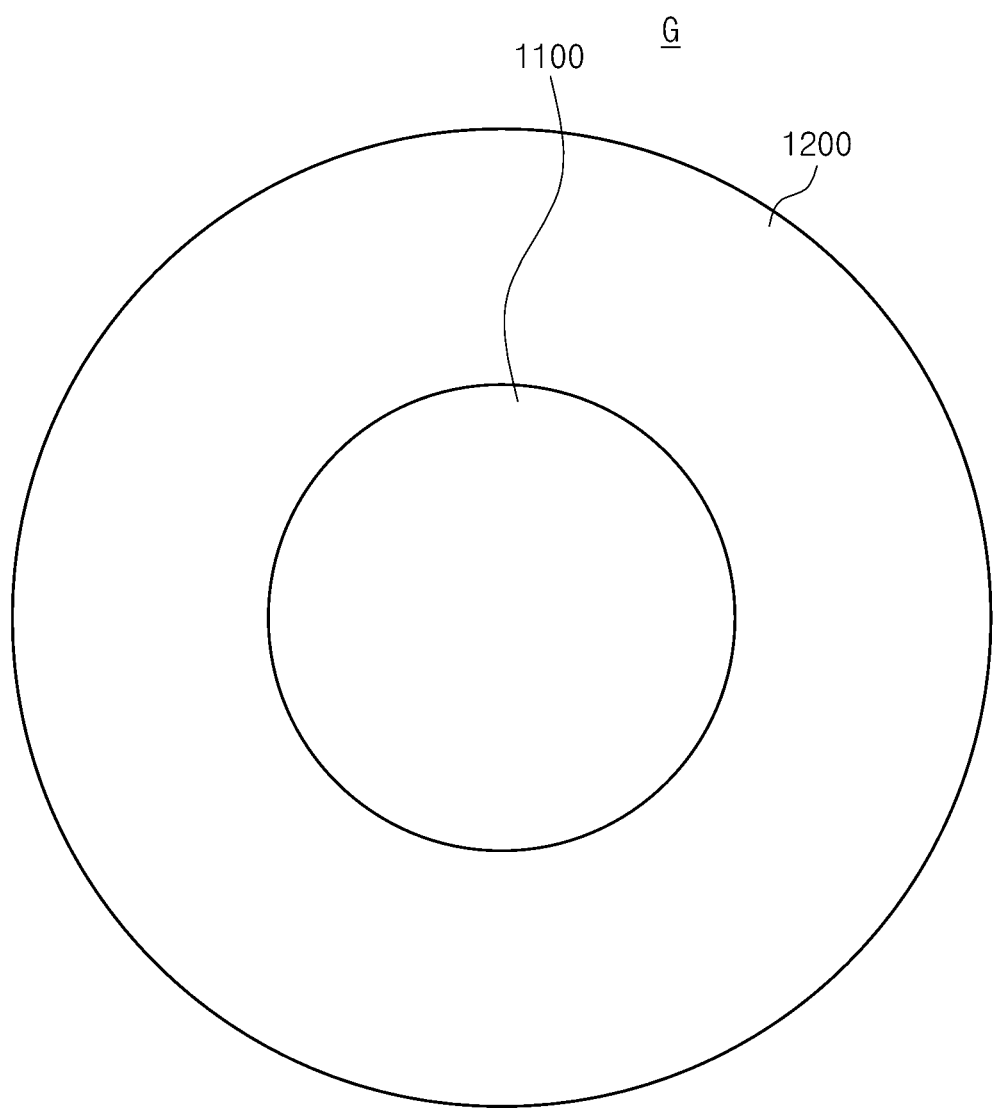
FIG. 11 is a plan view illustrating one embodiment of a jig used to clean a processing vessel.

FIG. 11 is a plan view illustrating one embodiment of the jig used to clean the processing vessel. Referring to FIG. 11, the jig G may be divided into a central region 1100 and an edge region 1200 when viewed from above. The area of the central region 1100 may correspond to the area of the support plate 832. The central region 1100 may have higher elasticity than the edge region 1200. For example, the central region 1100 may be made of a material having elasticity higher than that of the edge region 1200. The central region 1100 may be provided as a central plate made of a first material, and the edge region 1200 may be provided as an edge plate made of a second material. The second material may have lower elasticity than the first material.

Because the central region 1100 of the jig G is made of the material having elasticity higher than that of the edge region 1200, the edge region 1200 may be more easily upwardly inclined toward the outside when the support plate 832 applies vacuum pressure to the jig G.

Furthermore, the central region 1100 may be thinner than the edge region 1200. In this case, the jig G may have the same diameter as the substrate W. Accordingly, the edge region 1200 may be more easily upwardly inclined toward the outside when the support plate 832 applies the vacuum pressure to the jig G.

Figure 12:
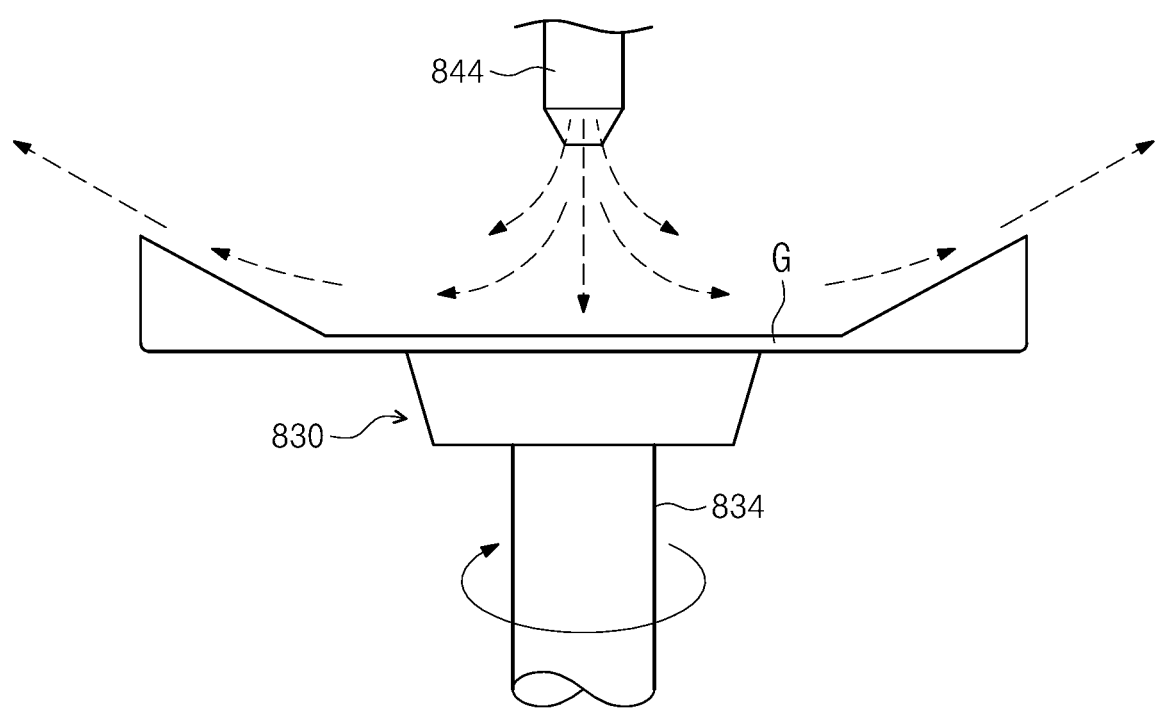
FIG. 12 is a sectional view illustrating another embodiment of a jig used to clean a processing vessel.

FIG. 12 is a sectional view illustrating another embodiment of the jig used to clean the processing vessel.

Referring to FIG. 12, the jig G may have a flat central region and an upwardly inclined edge region. When the cleaning solution dispensing member 844 dispenses the cleaning solution toward the center of the rotating jig G, the cleaning solution may be scattered in an upwardly inclined direction, with the upwardly inclined edge region as a path. Effects obtained are the same as, or similar to, those of the above-described embodiments, and therefore repetitive descriptions thereabout will be omitted.

In the above embodiments, it has been exemplified that the jig G has the flat central region and the upwardly inclined edge region. Without being limited thereto, however, the jig G may be modified in various shapes. For example, the jig G may have, on the edge region, a plurality of protrusions upwardly inclined toward the outside. Alternatively, the jig G may have, on the edge region, a plurality of protrusions upwardly inclined toward the outside and a plurality of indentations downwardly inclined toward the outside. In another case, the edge region of the jig G may be upwardly inclined toward the outside and may have a corrugated shape along the circumferential direction. Accordingly, the cleaning solution dispensed onto the jig G may be scattered in various directions to efficiently clean the processing vessel 850.

According to the embodiments of the inventive concept, the processing vessel may be efficiently cleaned.

According to the embodiments of the inventive concept, the processing vessel may be efficiently cleaned without a change in the substrate treating equipment system.

Effects of the inventive concept are not limited to the above-described effects, and any other effects not mentioned herein may be clearly understood from this specification and the accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. An apparatus for treating a substrate, the apparatus comprising:
   a processing vessel having a processing space inside;
   a substrate support unit configured to support and rotate the substrate or a jig in the processing space;
   a liquid dispensing unit including a treating liquid dispensing member configured to dispense a treating liquid for treating the substrate and a cleaning solution dispensing member configured to dispense a cleaning solution for cleaning the processing vessel; and
a controller configured to control the substrate support unit and the liquid dispensing unit,
wherein the substrate support unit includes:
a support plate having a vacuum line formed therein to clamp the substrate by vacuum pressure; and
a pressure-reducing member configured to produce the vacuum pressure in the vacuum line, and
wherein the controller controls the substrate support unit and the liquid dispensing unit to perform a first clamping step of clamping the substrate to the support plate by producing a first vacuum pressure in the vacuum line when treating the substrate by dispensing the treating liquid onto the substrate supported on the substrate support unit and clamping the jig to the support plate by producing a second vacuum pressure different from the first vacuum pressure, in the vacuum line when cleaning the processing vessel by dispensing the cleaning solution onto the jig supported on the substrate support unit.

2. The apparatus of claim 1, wherein the second vacuum pressure is higher than the first vacuum pressure.

3. The apparatus of claim 2, wherein the controller performs a second clamping step of clamping the jig to the support plate by a third vacuum pressure different from the second vacuum pressure when cleaning the processing vessel by dispensing the cleaning solution onto the jig supported on the substrate support unit.

4. The apparatus of claim 3, wherein the third vacuum pressure is the same as the first vacuum pressure.

5. The apparatus of claim 3, wherein the controller repeatedly performs the first clamping step and the second clamping step while cleaning the processing vessel by dispensing the cleaning solution onto the jig.

6. The apparatus of claim 1, further comprising:
a lifting unit configured to adjust a relative height between the substrate support unit and the processing vessel,
wherein the controller controls the lifting unit, and
wherein the controller varies the relative height between the substrate support unit and the processing vessel while cleaning the processing vessel by dispensing the cleaning solution onto the jig.

7. The apparatus of claim 1, wherein the jig has the same size as the substrate.

8. The apparatus of claim 7, wherein the support plate has a smaller size than the substrate.

* * * * *